(12) United States Patent
Zhang et al.

(10) Patent No.: US 8,941,427 B2
(45) Date of Patent: Jan. 27, 2015

(54) CONFIGURABLE FLIP-FLOP

(75) Inventors: Shayan Zhang, Tianjin (CN);
Ravindraraj Ramaraju, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 137 days.

(21) Appl. No.: 13/326,685

(22) Filed: Dec. 15, 2011

(65) Prior Publication Data
US 2013/0154708 A1    Jun. 20, 2013

(51) Int. Cl.
*H03K 3/289* (2006.01)
(52) U.S. Cl.
USPC .......................................................... 327/202
(58) Field of Classification Search
USPC .................. 327/199–203, 208, 210–215, 218
See application file for complete search history.

(56) References Cited

U.S. PATENT DOCUMENTS

| | | | |
|---|---|---|---|
| 5,889,788 A * | 3/1999 | Pressly et al. | 714/726 |
| 5,920,575 A * | 7/1999 | Gregor et al. | 714/726 |
| 7,155,618 B2 | 12/2006 | Moyer et al. | |
| 7,362,134 B2 | 4/2008 | Bajkowski et al. | |
| 7,453,756 B2 | 11/2008 | Moyer et al. | |
| 7,548,102 B2 | 6/2009 | Ramaraju et al. | |
| 7,548,103 B2 | 6/2009 | Ramaraju et al. | |
| 7,710,177 B2 | 5/2010 | Hoover | |
| 7,800,974 B2 * | 9/2010 | Zhang et al. | 365/233.1 |
| 7,843,218 B1 | 11/2010 | Ramaraju et al. | |
| 2002/0075058 A1 | 6/2002 | Hwang et al. | |
| 2003/0226000 A1 | 12/2003 | Rhoades | |
| 2006/0192596 A1 | 8/2006 | Ramaraju et al. | |
| 2006/0192604 A1 | 8/2006 | Ramaraju et al. | |
| 2008/0086626 A1 | 4/2008 | Jones et al. | |
| 2008/0250271 A1 | 10/2008 | Ozer et al. | |
| 2009/0213668 A1 | 8/2009 | Zhang et al. | |
| 2009/0256608 A1 | 10/2009 | Djaja et al. | |

OTHER PUBLICATIONS

Hill, E. et al., "Transparent Mode Flip-Flops for Collapsible Pipelines," IEEE 25th International Conference on Computer Design, 2007; ISBN 1-4244-1258-7; pp. 553-560.
Fallah, F. et al., "Standby and Active Leakage Current Control and Minimization in CMOS VLSI Circuits", IEICE Transactions on Electronics (Jan. 2005), vol. E88-C, Issue: 4, pp. 509-519, ISSN: 0916-8524.
Freescale Semiconductor Inc., "Freescale Technologies for Energy Efficiency", Whitepaper, (Jan. 2007), Document No. ENERGYEF-FWP Rev 1, pp. 1-9.
Jacobson, H. et al., "Stretching the Limits of Clock-Gating Efficiency in Server-Class Processors", Proceedings of the 11th Int'l Symposium on High-Performance Computer Architecture (HPCA-11 2005), Feb. 12, 2005, ISSN: 1530-0897, pp. 238-242.
Jiao, H. et al., "Low-Leakage and Compact Registers with Easy-Sleep Mode", Journal of Low Power Electronics, vol. 6, Feb. 2010, ISSN: 1546-1998, pp. 1-17.

(Continued)

*Primary Examiner* — Sibin Chen (57) ABSTRACT

A configurable flip-flop can be operated in a normal mode and a buffer mode. In the normal mode, the flip-flop latches data at the flip-flop input based on a clock signal. In the buffer mode, the flip-flop provides data at the flip-flop input to the flip-flop output, independent of the clock signal.

13 Claims, 7 Drawing Sheets

(56) References Cited

OTHER PUBLICATIONS

Mahmoodi-Meimand, H. et al., "Data-Retention Flip-Flops for Power-Down Applications", Proceedings of the 2004 International Symposium on Circuits and Systems, 2004, May 23-26, 2004, vol. 2, ISBN: 0-7803-8251-X; 4 pages.

U.S. Appl. No. 13/403,597, filed Feb. 23, 2012, entitled "Recoverable and Reconfigurable Pipeline Structure for State-Retention Power Gating".

Non-Final Office Action mailed Mar. 7, 2013 for U.S. Appl. No. 13/403,597.

* cited by examiner

FIG. 9

CONFIGURABLE FLIP-FLOP

FIELD OF THE DISCLOSURE

The present disclosure relates to electronic devices, and more particular to flip-flops for electronic devices.

BACKGROUND

Flip-flops are sometimes employed in an electronic device to store information between stages of a pipeline, such as an instruction pipeline. However, some flip-flops, such as state-retention flip-flops that are able to retain stored information when the electronic device is placed in a low-power mode, take a relatively large amount of circuit area, and are therefore less desirable for use in the pipeline. Further, such flip-flops can increase the complexity of testing procedures for the pipeline.

BRIEF DESCRIPTION OF THE DRAWINGS

The present disclosure may be better understood, and its numerous features and advantages made apparent to those skilled in the art by referencing the accompanying drawings.

DETAILED DESCRIPTION

FIGS. 1-9 illustrate techniques for employing a configurable flip-flop in an electronic device, whereby the flip-flop can be operated in a normal mode and a buffer mode. In the normal mode, the flip-flop latches data at the flip-flop input based on a clock signal. In the buffer mode, the flip-flop provides data at the flip-flop input to the flip-flop output, independent of the clock signal. The buffer mode can be used to effectively bypass the latching function of the flip-flop without changing gate delays in the flip-flop's data path. Accordingly, the flip-flop can be useful in, for example, testing of pipeline stages.

Figure 1:
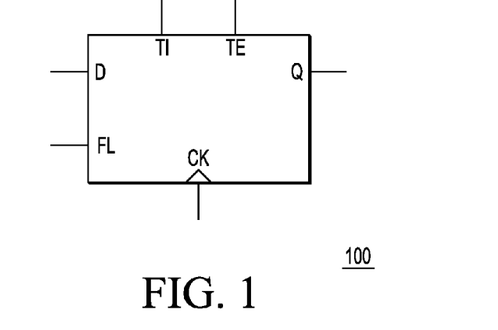
FIG. 1 is a block diagram illustrating a flip-flop of an electronic device in accordance with one embodiment of the present disclosure.

FIG. 1 illustrates a block diagram of a flip-flop 100 in accordance with one embodiment of the present disclosure. The flip-flop 100 includes a data input labeled "D", a data output labeled "Q", a clock input labeled "CK", and a flush control input labeled "FL." In addition, the flip-flop 100 includes a test enable input labeled "TE" and a test data input, labeled "TI."

The flip-flop 100 is generally configured to provide data present at its effective data input to its data output Q. A signal at the test enable TE controls whether the data input D or the test input TI is treated by the flip-flop 100 as the effective data input. For example, in one embodiment when a signal at the test input TI is negated, the data input D is selected as the effective data input, and when the signal at the test input TI is asserted, the test input TI is treated as the effective data input. In an embodiment, the data input D is connected to a data path of an electronic device employed for normal operation of the device, while the test input TI is connected to a test path. This allows the flip-flop 100 to be used for testing of the electronic device, wherein test data is inserted into the data path via the TI input to test modules downstream of the flip-flop 100. For purposes of discussion of the operation of flip-flop 100 below, it is assumed that the data input D is the effective input unless otherwise indicated.

During operation, a signal at the flush control input FL (referred to as a flush control signal) controls whether the flip-flop 100 is in the normal mode or the buffer mode. Accordingly, the flush control signal controls the timing of the flip-flop 100's provision of data, and whether that data is latched. This can be better understood with reference to FIG. 2, which depicts a set of waveforms illustrating operation of the flip-flop 100 in accordance with one embodiment of the present disclosure. In particular, waveforms 201-204 are a set 215 of signals associated with a normal mode of operation of flip-flop 100 and waveforms 205-208 are a set 220 of signals associated with a buffer mode of operation of flip-flop 100.

Figure 2:
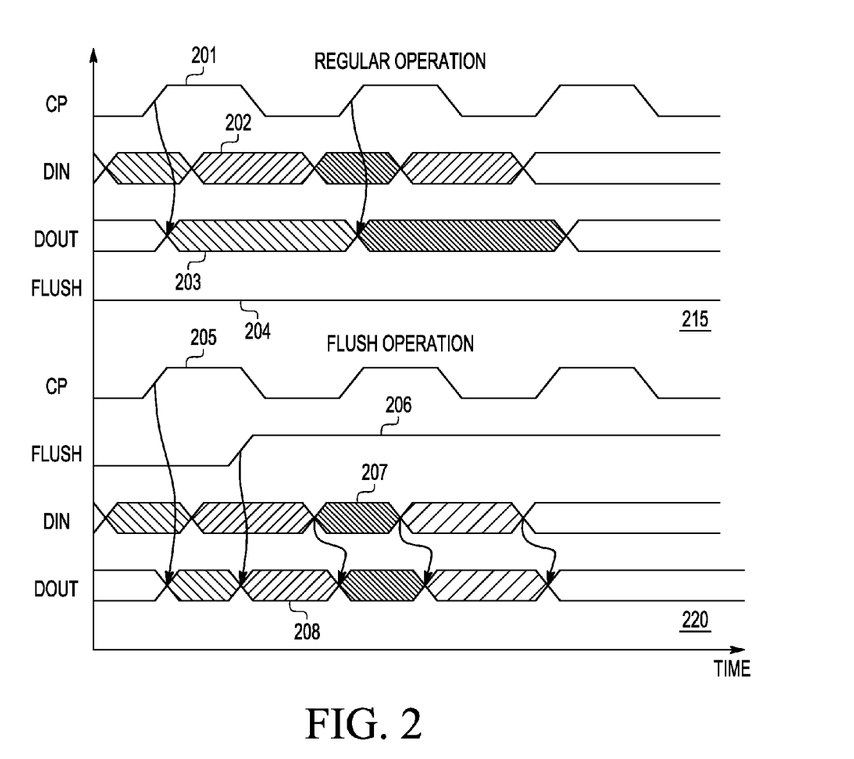
FIG. 2 is a timing diagram illustrating operation of the flip-flop of FIG. 1 in accordance with one embodiment of the present disclosure.

To illustrate, waveforms 201 and 205 depict a clock signal CP applied to the clock input CK, waveforms 202 and 207 depict a data signal DIN applied to the data input D, waveforms 203 and 208 depict a data signal DOUT provided at the data output Q, and waveforms 204 and 206 depict a flush control signal FLUSH provided at the flush control input FL of flip-flop 100. As illustrated by waveform 204, in the normal mode of operation the signal FLUSH is negated. Accordingly, the flip-flop 100 is in the normal mode and latches the signal DIN in response to a rising edge of the clock signal CP. That is, data present at the data input D when the clock signal CP experiences a rising edge is provided at the data output Q, and continues to be provided until the next rising edge of the clock signal CP.

As illustrated by waveform 206, in the buffer mode of operation the signal FLUSH is asserted. In response, the flip-flop 100 operates as a buffer, wherein data present at the data input D is provided at the data output Q independent of the clock signal CP. Accordingly, in the buffer mode, the signal DOUT follows the signal DIN without regard to the rising and falling edges of the clock signal CP. As used herein, a flip-flop, or stage of a flip-flop, buffers data when the flip-flop or flip-flop stage is configured such that it provides data at its input to its output independent of the clock signal and without latching the data. In an embodiment, the signal FLUSH is independent of both the clock signal CP and any test signal applied to TE input. Accordingly, the flip-flop 100 can be placed in the buffer mode both during testing of a data processing device that incorporates the flip-flop, and during normal operation of the data processing device.

Figure 3:
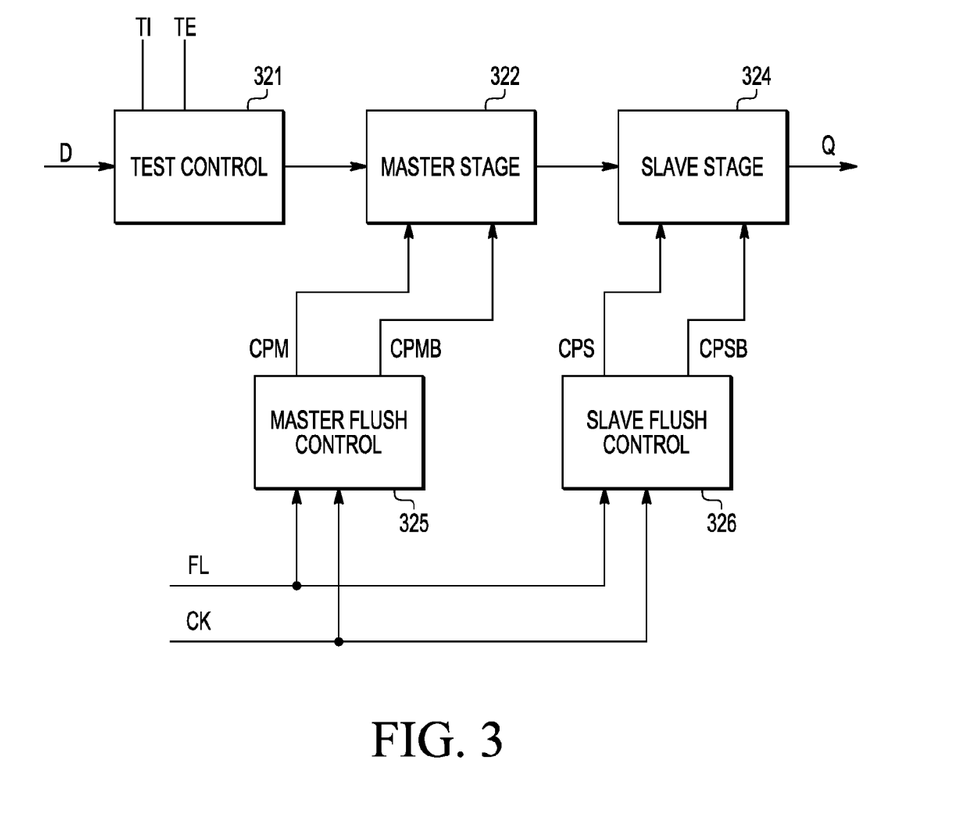
FIG. 3 is a block diagram illustrating a particular embodiment of the flip-flop of FIG. 1.

FIG. 3 illustrates a particular embodiment of the flip-flop 100. In the illustrated embodiment, the flip-flop 100 includes a test control module 321, a master stage 322, a slave stage 324, a master flush control module 325, and a slave flush control module 326. The test control module includes an input connected to the data input D, an input connected to the test input TI, an input connected to the test enable input TE, and an output. The master stage 322 includes an input connected to the output of the test control module 321, an input to receive a signal labeled CPM, an input to receive a signal labeled CPMB, and an output. The slave stage 324 includes an input connected to the output of the master stage 322, an input to receive a signal labeled CPS, an input to receive a signal labeled CPSB, and an output connected to the data output Q. The master flush control module 325 includes an input connected to the flush control input FL, an input connected to the clock input CK, an output to provide the signal CPM, and an output to provide the signal CPMB. The slave flush control module 326 includes an input connected to the flush control input FL, an input connected to the clock input CK, an output to provide the signal CPS, and an output to provide the signal CPSB.

The test control module 321 is a set of logic gates connected such that, based upon a signal applied at the TE input, select one of the data input D and the test input TI to be connected to the test control module output. Thus, for example, when a signal applied at the TE input is asserted, the test input TI is connected to the output of the test control module 321. When a signal applied at the TE input is negated, the data input D is connected to the output of the test control module 321.

The master stage 322 is a set of logic gates configured to, when the latch 100 is in the normal mode, latch data at the stage input in response to assertion of the signal CPM and negation of the signal CPMB. In the buffer mode, the signals CPM and CPMB are maintained in states such that the master stage 322 is configured buffer the input data independent of any clock signal connected to the CK input.

The slave stage 324 is a set of logic gates configured to, when the latch 100 is in the normal mode, latch data at the stage input in response to assertion of the signal CPS and negation of the signal CPSB. In the buffer mode, the signals CPS and CPSB are maintained in states such that the slave stage 324 is configured buffer the input data independent of any clock signal connected to the CK input.

The master flush control module 325 is a set of logic gates configured to generate the signals CPM and CPMB based on the signals received via the FL and CK inputs. Accordingly, when a signal provided via the FL input is negated so that the flip-flop 100 is in the normal mode, the master flush control module 325 generates the signal CPM such that the signal follows a clock signal provided via the CK input and the signal CPMB is an inverted representation of the clock signal. Thus, when the flip-flop 100 is in the normal mode, the master flush control module 325 effectively provides complementary clock signals via the CPM and CPMB signals, so that the master stage 322 operates as a latch. When the signal provided via the FL input is asserted so that the flip-flop 100 is in the buffer mode, the master flush control module 325 maintains the signal CPM in an asserted state and maintains the signal CPMB in a negated state. Maintaining these signals in these states places the master stage 322 in a buffering mode.

The slave flush control module 326 is a set of logic gates configured to generate the signals CPS and CPSB based on the signals received via the FL and CK inputs in similar fashion to the master flush control module 325. Accordingly, when the flip-flop 100 is in the normal mode, the slave flush control module 326 provides complementary clock signals via the CPS and CPSB signals, so that the slave stage 324 operates as a latch. When the flip-flop 100 is in the buffer mode, the slave flush control module 326 maintains the signal CPS in an asserted state and maintains the signal CPSB in a negated state thereby placing the slave stage 324 in the buffering mode.

Figure 4:
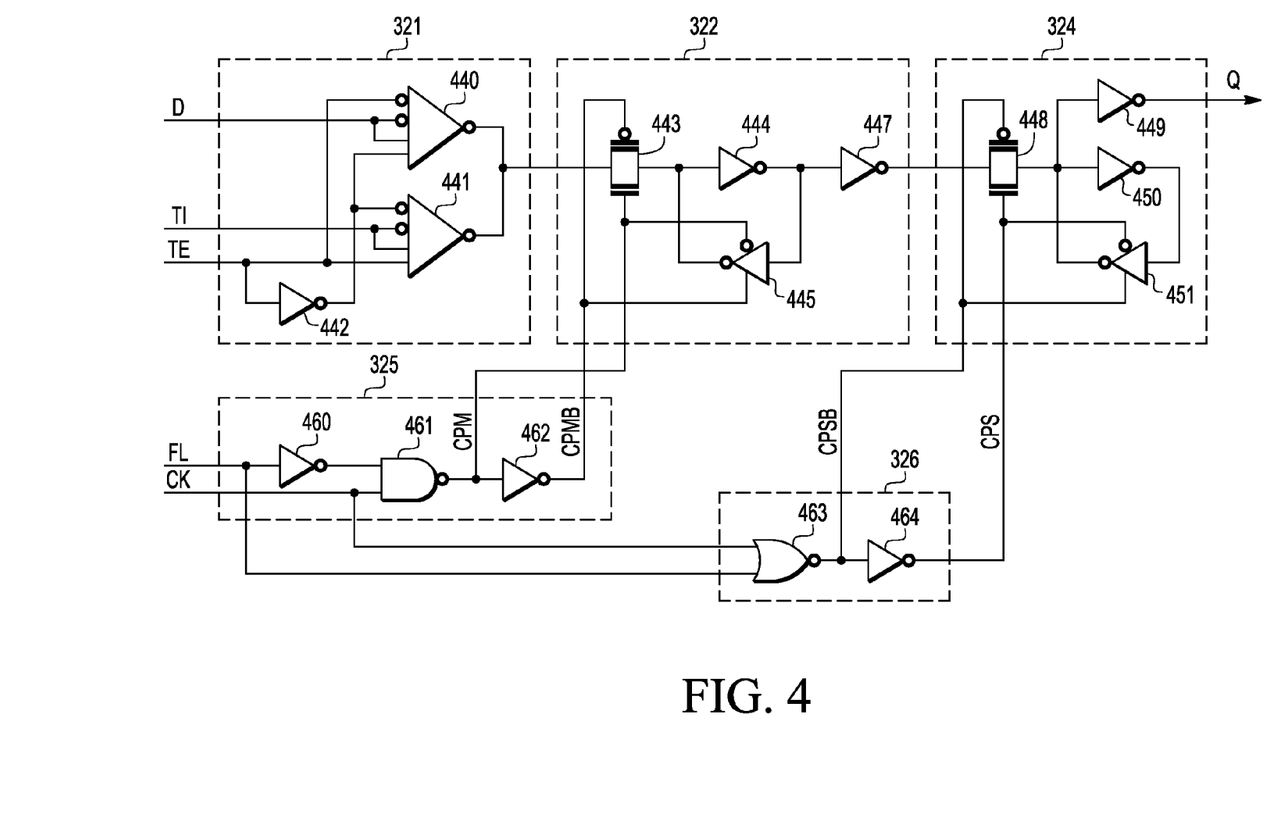
FIG. 4 is a block diagram illustrating the flip-flop of FIG. 2 in accordance with an embodiment of the present disclosure.

FIG. 4 illustrates a diagram of the flip-flop 100 in accordance with one embodiment of the present disclosure. In the illustrated embodiment, the test control module 321 includes tri-state inverters 440 and 441 and inverter 442. The inverter 442 includes an input connected to the TE input of the flip-flop 100. The tri-state inverter 440 includes a tri-state control input connected to the TE input, a tri-state control input connected to the output of the inverter 442, a data input connected to the data input D of the flip-flop 100, and an output. The tri-state inverter 441 includes a tri-state control input connected to the TE input, a tri-state control input connected to the output of the inverter 442, a data input connected to the test data input TI of the flip-flop 100, and an output. The outputs of the inverters 440 and 441 are connected to a common node that provides the output of the test control module 321.

The master stage 322 includes a pass gate 443, inverters 444 and 447, and tri-state inverter 445. The pass gate 443 includes a first terminal connected to the output node of the inverters 440 and 441, a second terminal, a control terminal to receive the signal CPM and a control terminal to receive the signal CPMB. The inverter 444 includes an input connected to the second terminal of the pass gate 443, and an output. The tri-state inverter 445 includes an input connected to the output of the inverter 444, an output connected to the input of the inverter 444, a tri-state control input to receive the signal CPM and a tri-state control input to receive the signal CPMB. The inverter 447 includes an input connected to the output of the inverter 444 and an output.

The slave stage 324 includes a pass gate 448, inverters 449 and 450, and tri-state inverter 451. The pass gate 448 includes a first terminal connected to the output of the inverter 447, a second terminal, a control terminal to receive the signal CPS and a control terminal to receive the signal CPSB. The inverter 450 includes an input connected to the second terminal of the pass gate 448, and an output. The tri-state inverter 451 includes an input connected to the output of the inverter 450, an output connected to the input of the inverter 450, a tri-state control input to receive the signal CPS and a tri-state control input to receive the signal CPSB. The inverter 449 includes an input connected to the second terminal of the pass gate 448 and an output connected to the data output Q of the flip-flop 100.

The master flush control module 325 includes an inverter 460, a NAND gate 461, and an inverter 462. The inverter 460 includes an input connected to the FL input of the flip-flop 100 and an output. The NAND gate 461 includes an input connected to the output of the inverter 460, an input connected to the CK input of the flip flop 100, and an output to provide the signal CPM. The inverter 462 includes an input connected to the output of the NAND gate 461 and an output to provide the signal CPMB. The slave flush control module 326 includes a NOR gate 463 and an inverter 464. The NOR gate 463 includes an input connected to the FL input, an input connected to the CK input, and an output to provide the signal CPSB. The inverter 464 includes an input connected to the output of the NOR gate 463 and an output to provide the signal CPS.

In operation, the test control signal provided via the TE input selects one of the inverter 440 and the inverter 441 to be placed in a tri-state condition and the other inverter to be placed in a normal operating condition. The test control signal thereby selects either the D input or the TI input to be the effective data input for the flip-flop 100.

The master flush control module 325 generates the signals CPM and CPMB based on the signal FLUSH (provided via the FL input) and the clock signal CP (provided via the CK input). When the signal FLUSH is negated, indicating normal mode, the signal CP controls the state of the signals CPM and CPMB, such that CPM is a delayed version of the signal CP and the signal CPMB is a complement of the signal CPM. Accordingly, when the signal CPM is asserted, the pass gate 443 provides data at the effective data input to the inverter 444. When the CPM signal is negated, the tri-state inverter 445 is placed in a normal mode of operation, thereby latching the data. When the FLUSH signal is asserted, indicating buffer mode, the NAND gate 461 maintains the signal CPM in an asserted state, thereby maintaining the pass gate 443 in a connected state and the tri-state inverter 445 in a tri-state condition. This places the master stage 322 in a buffer mode.

The slave flush control module 326 generates the signals CPS and CPSB based on the signal FLUSH and the clock signal CP. When the signal FLUSH is negated the signal CP controls the state of the signals CPS and CPSB, such that CPS is a delayed version of the signal CP and the signal CPSB is a complement of the signal CPS. Accordingly, when the signal CPSB is asserted, the pass gate 448 provides data output of the master stage 322 to the inverter 449. When the CPS signal is negated, the tri-state inverter 451 is placed in a normal mode of operation, thereby latching the data. When the FLUSH signal is asserted, indicating buffer mode, the NOR gate 463 maintains the signal CPSB in a negated state, thereby maintaining the pass gate 448 in a connected state and the tri-state inverter 451 in a tri-state condition. This places the slave stage 324 in a buffer mode. Accordingly, in the normal mode, the master stage 322 and slave stage 324 are each configured to operate as latches such that the stages latch data based on edges of the clock signal CP. In the buffer mode, the master stage 322 and slave stage 324 are each configured to operate as buffers, such that the stages provide data at their inputs independent of the clock signal CP.

Figure 5:
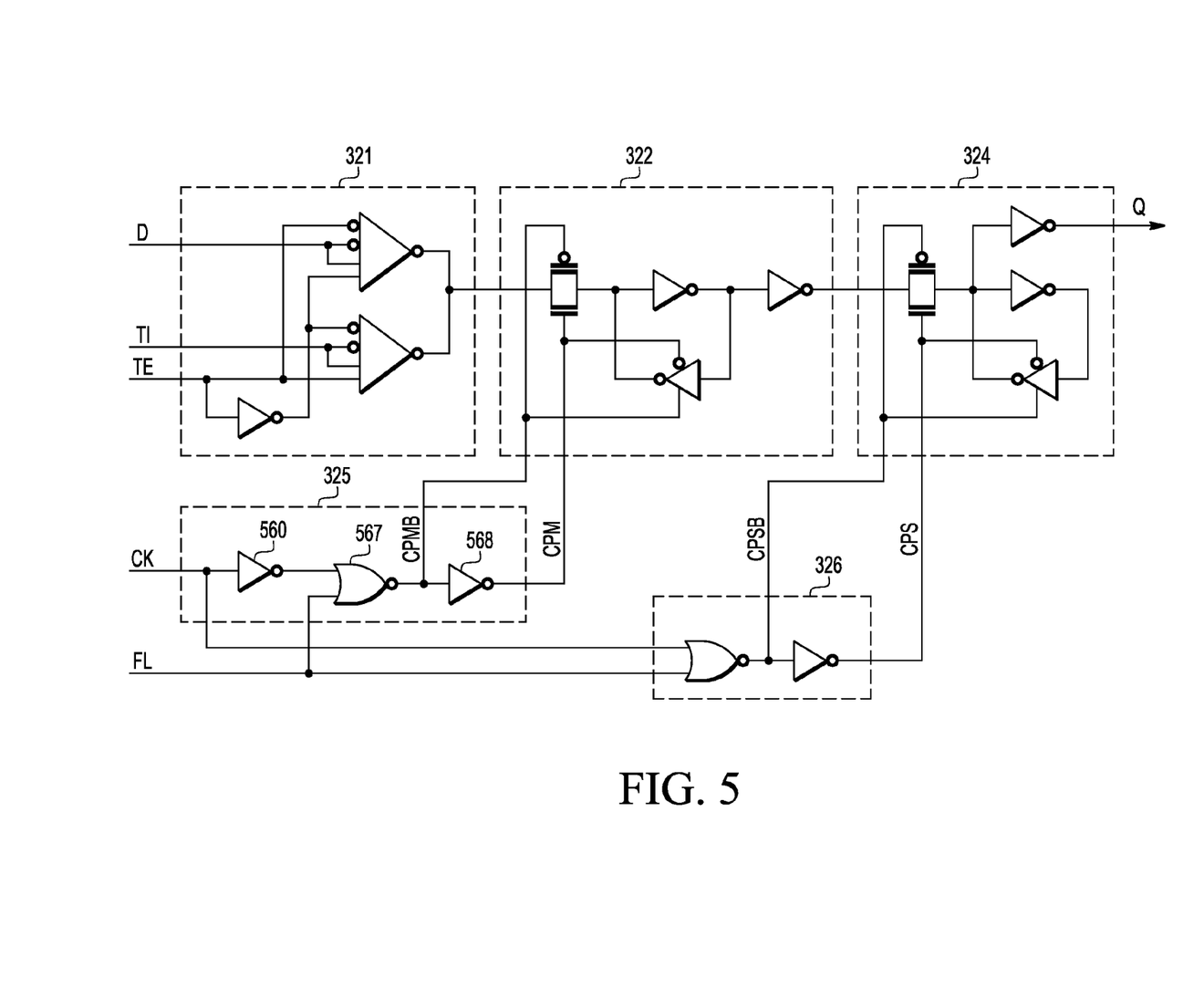
FIG. 5 is a block diagram illustrating the flip-flop of FIG. 2 in accordance with another embodiment of the present disclosure.

FIG. 5 illustrates a diagram of the flip-flop 100 in accordance with another embodiment of the present disclosure. In the illustrated embodiment of FIG. 5, the test control module 321, master stage 322, slave stage 324, and slave flush control module 326 include the same logic gates connected in substantially the same arrangement as the corresponding items of FIG. 4. Further, in the illustrated embodiment, the master flush control module 325 includes an inverter 560, a NOR gate 567, and an inverter 568. The inverter 560 includes an input connected to the CK input and an output. The NOR gate 567 includes an input connected to the output of the inverter 560, an input connected to the FL input, and an output to provide the signal CPMB. The inverter 568 includes an input connected to the output of the NOR gate 567 and an output to provide the signal CPM. In operation, the connectivity of the inverter 560, the NOR gate 567, and the inverter 568 such that the signals CPM and CPMB will be substantially the same as the corresponding signals generated by the master flush control module 325 of FIG. 4.

Figure 6:
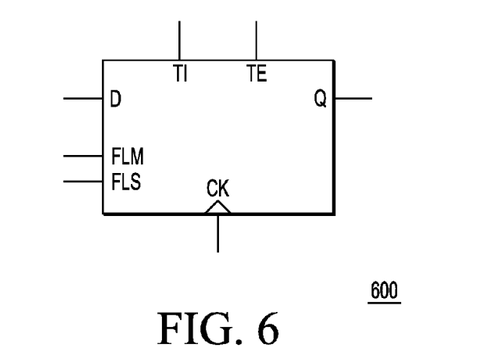
FIG. 6 is a block diagram illustrating a particular embodiment of the flip-flop of FIG. 1.

FIG. 6 illustrates a block diagram of a flip-flop 600 in accordance with one embodiment of the present disclosure. Flip-flop 600 is configured similarly to flip-flop 100 of FIG. 1, but illustrates that the flush control input FL of flip-flop 100 can represent multiple flush control inputs. In particular, in the example of FIG. 6, the flip-flop 100 includes a flush control input labeled FLM and a flush control input labeled FLS. The multiple flush control inputs allow signals at those inputs to control whether individual stages of the flip-flop 600 are placed in the latch mode or in the buffering mode. This can be better understood with reference to FIG. 7, which illustrates a particular embodiment of the flip-flop 600 includes a test control module 621, a master stage 622, a slave stage 624, a master flush control module 625, and a slave flush control module 626.

Figure 7:
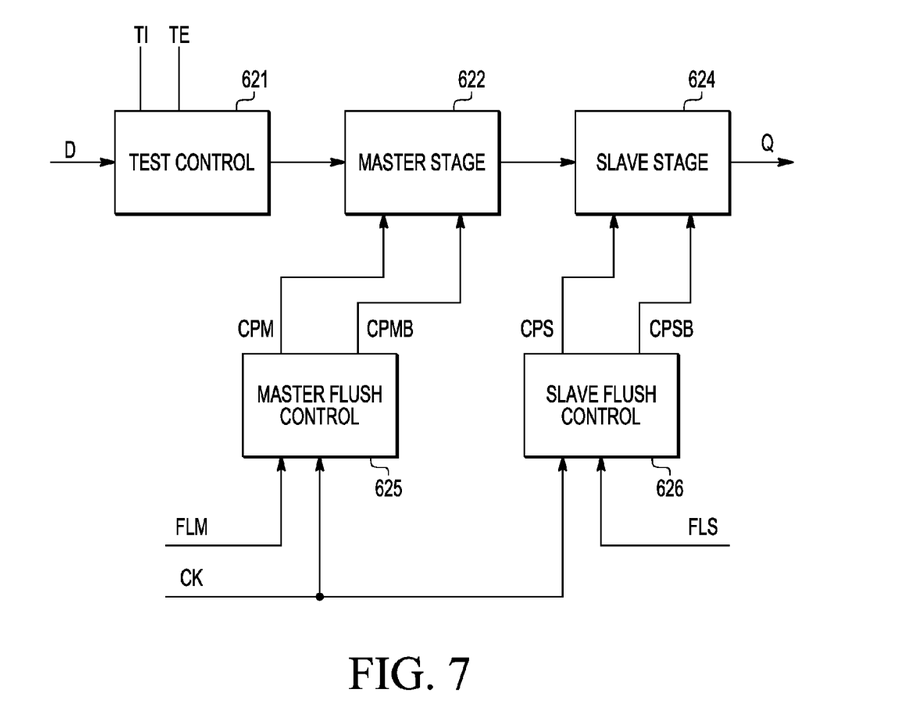
FIG. 7 is a block diagram of the flip-flop of FIG. 6 in accordance with another embodiment of the present disclosure.

The test control module 621, a master stage 622, a slave stage 624 are configured similarly to the corresponding modules of FIG. 3. The master flush control module 625 is a set of logic gates configured to generate the signals CPM and CPMB based on the signals received via the FLM and CK inputs. Accordingly, when a signal (referred to as the master flush control signal) provided via the FLM input is negated so that the master stage 622 is in the normal mode, the master flush control module 625 generates the signals CPM and CPMB such that the master stage 622 operates as a latch controlled by a clock signal provided via the CK input. When master flush control signal is asserted so that the master stage 622 is in the buffer mode, the master flush control module 625 maintains the signal CPM in an asserted state and maintains the signal CPMB in a negated state, thereby placing the master stage 622 in the buffering mode. The slave flush control module 626 is a set of logic gates configured to generate the signals CPS and CPSB based on the signals received via the FLS input (the signal referred to as the slave flush control signal) and CK inputs in similar fashion to the master flush control module 625. Accordingly, when the slave flush control signal indicates the normal mode, the slave flush control module 626 provides complementary clock signals via the CPS and CPSB signals, so that the slave stage 624 operates as a latch based on the clock signal. When the slave flush control signal indicates the buffer mode, the slave flush control module 626 maintains the signal CPS in an asserted state and maintains the signal CPSB in a negated state thereby placing the slave stage 624 in the buffering mode.

The master flush control and slave flush control signals can be individually set, such that one of the stages of the flip flop 600 can be placed in the normal mode and the other stage placed in the buffer mode. As described further herein, this can be useful in testing logic modules connected between instances of the flip-flop 600.

Figure 8:
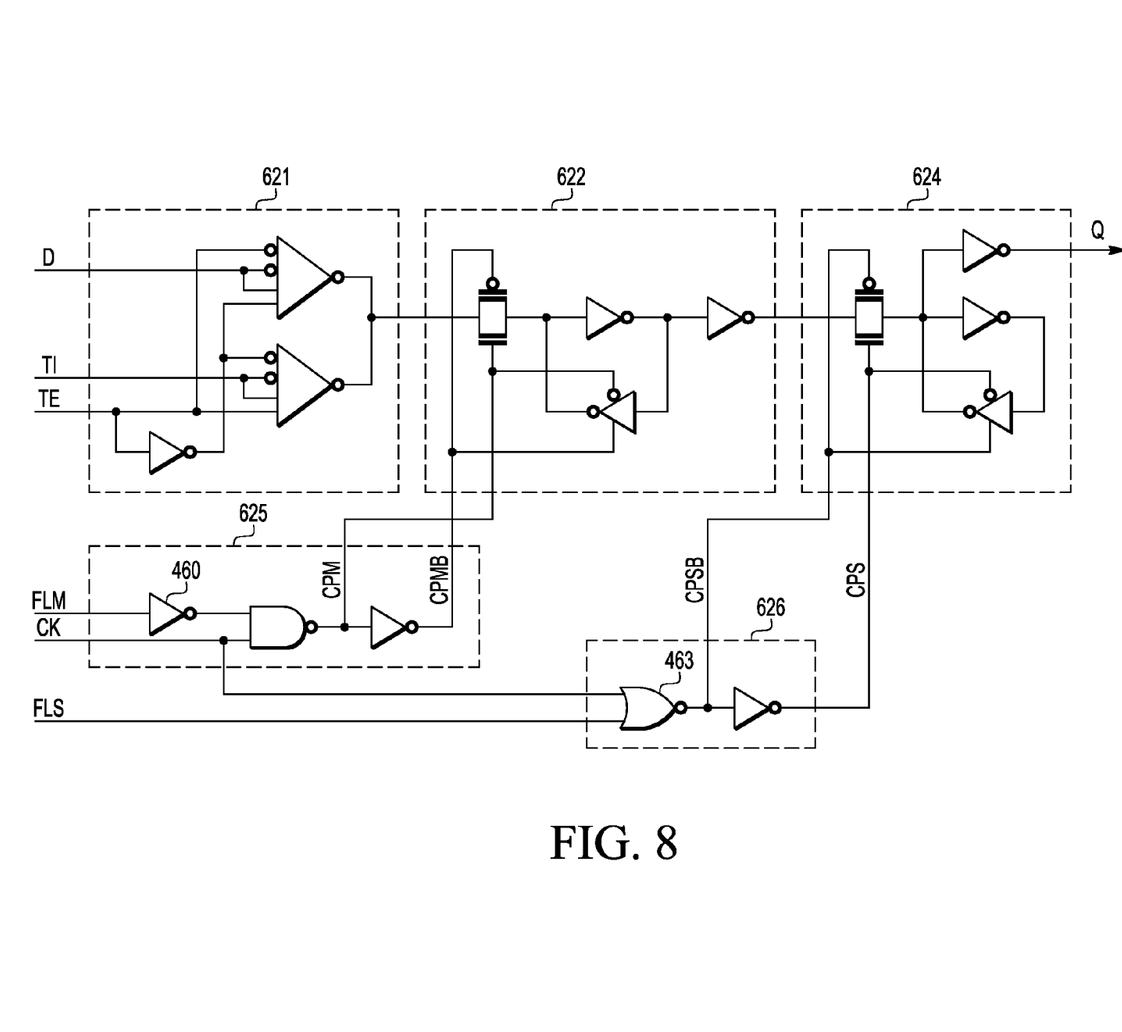
FIG. 8 is a block diagram illustrating the flip-flop of FIG. 7 in accordance with an embodiment of the present disclosure.

FIG. 8 depicts a diagram of the flip-flop 600 in accordance with another embodiment of the present disclosure. In the illustrated embodiment of FIG. 8, the test control module 621, master stage 622, and slave stage 624, include similar logic gates connected in substantially the same arrangement as the corresponding items of FIG. 4. Further, the master flush control module 625 and slave flush control 626 include similar logic gates connected in substantially the same arrangement as the corresponding items of FIG. 4, with the exception that the input of the inverter 460 is connected to the FLM input of the flip-flop 600, and the NOR gate 463 includes an input connected to the input CK and an input connected to the input FLS of the flip-flop 600. In another embodiment, the master flush control module 625 can be configured similarly to the master flush control module 325 of FIG. 5, with the exception that the NOR gate 567 includes an input connected to the output of the inverter 560 and an input connected to the input FLM of the flip-flop 600.

Figure 9:
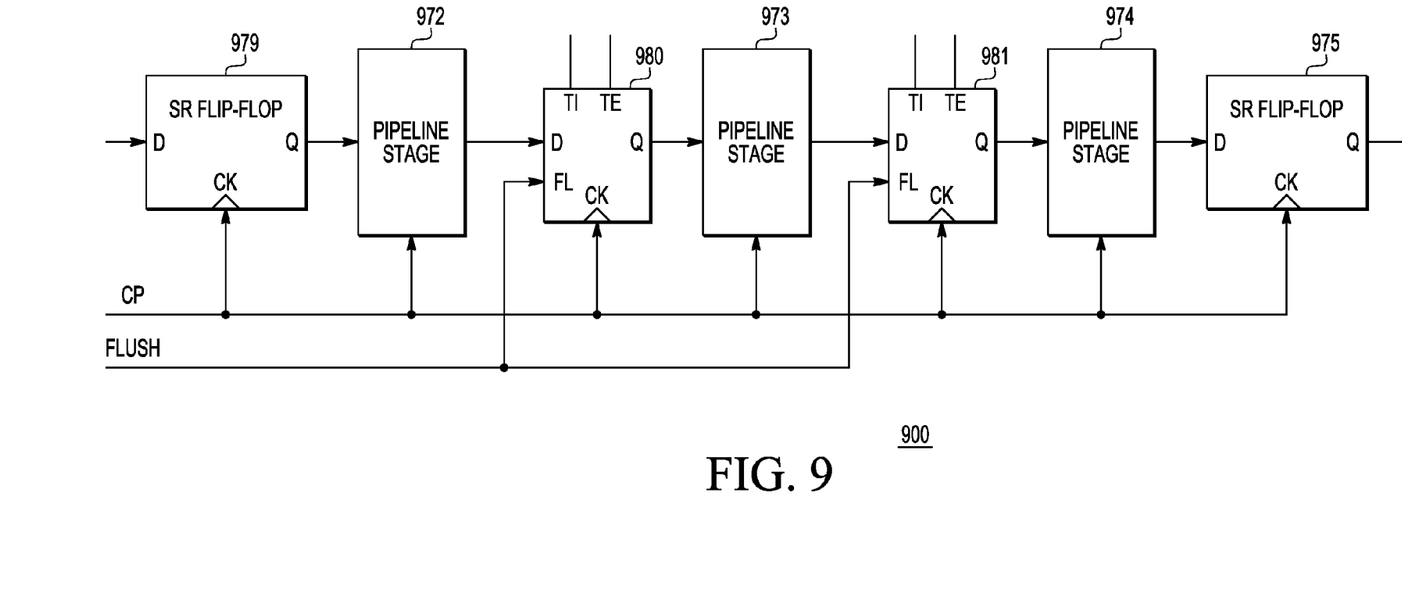
FIG. 9 is a block diagram of a pipeline incorporating the flip-flop of FIG. 1 in accordance with one embodiment of the present disclosure.

FIG. 9 illustrates a block diagram of a pipeline 900 of an electronic device in accordance with one embodiment of the present disclosure. In an embodiment, the pipeline 900 is an instruction pipeline of a data processor. The pipeline 900 includes state retention flip-flops 970 and 975, pipeline stages 972, 973, and 974, and flushable flip-flops 980 and 981. The flushable flip-flops 980 and 981 are each configured similarly to flip-flop 100 of FIG. 1.

State retention flip-flop 970 includes an input to receive data, an output, and a clock input to receive the clock signal CP. The pipeline stage 972 includes a connection to the output of the state retention flip-flop 970, a connection to receive the clock signal CP, and an output. The D input of the flushable flip-flop 980 is connected to the output of the pipeline stage 972, the FL input is connected to receive the flush control signal FLUSH, and the CK input is connected to receive the clock signal CP. The pipeline stage 973 includes a connection to the Q output of the flushable flip-flop 980, a connection to receive the clock signal CP, and an output. The D input of the flushable flip-flop 981 is connected to the output of the pipeline stage 973, the FL input is connected to receive the flush control signal FLUSH, and the CK input is connected to receive the clock signal CP. The pipeline stage 974 includes a connection to the Q output of the flushable flip-flop 981, a connection to receive the clock signal CP, and an output. The state-retention flip-flop 975 includes a data input connected to the output of the pipeline stage 974, a data output, and a clock input to receive the clock signal CP.

The state-retention flip-flops 970 and 975 are each configured to latch data at their inputs based on edges of the clock signal CP. In addition, the state-retention flip-flops 970 and 975 are each configured to retain their latched data when pipeline 900 is placed in a low-power mode.

The pipeline stages 972-974 are each configured to perform different operations to allow the pipeline 900 to execute its designated functions. For example, in an embodiment each of the pipeline stages 972-974 performs different operations for an instruction pipeline. Thus, pipeline stage 972 can be configured to dispatch instructions while pipeline 973 is configured to execute dispatched instructions. During operation, the pipeline stages 972-974 receive data from and provide data to the flip-flops connected to the corresponding stage. Thus, for example, the pipeline stage 972 can receive input data from the state-retention flip-flop 970 and provide output data to the flushable flip-flop 980.

The flush control signal FLUSH can be used to control whether the flushable flip-flops 980 and 981 are placed in the normal mode or the buffer mode. In one embodiment, the flushable flip-flops 980 and 981 are placed in the normal mode when the pipeline 900 is in a normal, active power mode and are placed in the buffering mode when the pipeline 900 is undergoing a power gating sequence to allow the pipeline 900 to exit the low-power mode efficiently. In particular, when the pipeline 900 is undergoing the power gating sequence, the clock signal CP can enter an indeterminate state. By placing the flip-flops 980 and 981 into the buffering mode as the pipeline 900 exits the low-power mode, any data retained in the pipeline 900 prior to the low-power mode can be flushed.

In addition, the flushable flip-flops 980 and 981 can be placed in the buffering mode during testing of the pipeline 900, thereby simplifying the test process. For example, by placing the flushable flip-flops 980 and 981 in the buffering mode, the scan chain for testing of the pipeline can be reduced, thereby reducing the complexity of the test process.

In an embodiment, the flushable flip-flops 980 and 981 can be configured similarly to the flip-flop 600 illustrated at FIG. 6, such that each of the flip-flops includes a master stage and slave stage that can individually be placed in the normal or buffering modes. Accordingly, during testing of the pipeline 900, the flip-flop 980 can be configured so that its master stage is placed in the normal mode and its slave stage is placed in the buffering mode. The flip-flop 980 is thus effectively configured as a transparent L1 latch (a latch that is controlled by rising edges of the clock signal CP). Further, the flip-flop 981 can be configured so that its master stage is placed in the buffering mode and its slave stage is placed in the normal mode. The flip-flop 981 is thus effectively configured as a transparent L2 latch (a latch that is controlled by the falling edge of the clock signal CP). This configuration can allow for the timing and operation of the stages of pipeline 900 to be tested in different ways, thus providing for testing flexibility.

In another embodiment, independent flush control signals can be provided to each of the flushable flip-flops in the pipeline, so that each flip-flop can be independently placed in the normal mode or the buffer mode. The state of each flush control signal can be set based on a value stored at a reprogrammable register, so that the mode of each flushable flip-flop can be reprogrammed by a user. In still another embodiment, the flush control signals can independently set the operating modes for each master and slave stage of the flushable-flip flops. Thus, the user can independently set the operating mode for each stage of each flushable flip-flop by storing a value at the reprogrammable register.

Note that not all of the activities or elements described above in the general description are required, that a portion of a specific activity or device may not be required, and that one or more further activities may be performed, or elements included, in addition to those described. Still further, the order in which activities are listed is not necessarily the order in which they are performed.

Also, the concepts have been described with reference to specific embodiments. However, one of ordinary skill in the art appreciates that various modifications and changes can be made without departing from the scope of the present disclosure as set forth in the claims below.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A device comprising a master-slave flip-flop, the flip-flop comprising:
    a master stage;
    a slave stage to receive first data propagated from an output of the master stage;
    a clock input;
    a first flush control input;
    a second flush control input;
    a data input; and
    a data output, the flip-flop configured to:
        when a first flush control signal at the first flush control input is in a first state, latch data present at the data input in response to assertion of a clock signal at the clock input;
        when the first flush control signal is in a second state, buffer data present at the data input independent of the clock signal at the clock input;
        when a second flush control signal at the second flush control input is in a third state, latch data present at the output of the master stage in response to assertion of a clock signal at the clock input; and
        when the second flush control signal is in a fourth state, buffer data present at the output of the master stage independent of the clock signal at the clock input.

2. The device of claim 1, wherein the flip-flop further comprises:
    the master stage comprising a master input coupled to the data input, a master output, and a first control input, the master stage configured to latch data at the master stage or buffer data at the master stage based on a first control signal at the first control input; and a master flush module comprising an input coupled to the first flush control input, an input coupled to the clock input and an output coupled to the first control input to provide the first control signal based on the first flush control signal and the clock signal.

3. The device of claim 1, wherein the flip-flop is configured to latch data or buffer data at the master stage of the flip-flop based on the first flush control signal and to latch data or buffer data at the slave stage of the flip-flop based on the second flush control signal at the second flush control input.

4. The device of claim 1, the flip-flop further comprising:
the master stage comprising a master input coupled to the data input, a master output, and a first control input, the master stage configured to latch data at the master stage or buffer data at the master stage based on a first control signal at the first control input; and
a master flush module comprising an input coupled to the first flush control input, an input coupled to the clock input and an output coupled to the first control input to provide the first control signal based on the first flush control signal and the clock signal.

5. The device of claim 4, wherein the flip-flop further comprises:
the slave stage comprising a slave input coupled to the master output, a slave output coupled to the data output, and a second control input, the slave stage configured to latch data at the slave stage or buffer data at the slave stage based on a second control signal at the second control input; and
a slave flush module comprising an input coupled to the second flush control input, an input coupled to the clock input and an output coupled to the second control input to provide the second control signal based on the second flush control signal and the clock signal.

6. The device of claim 1, wherein the flip-flop further comprises:
a test input;
a test enable input, the flip-flop configured to selectively couple the data input and the test input to the data output based on a test control signal at the test enable input.

7. The device of claim 1, further comprising:
a first stage of an instruction pipeline coupled to the data input of the flip-flop; and
a state-retention flip-flop comprising a data output coupled to the first stage of the instruction pipeline.

8. A master-slave flip-flop comprising:
an data input;
a master stage; and
a slave stage to receive first data propagated from an output of the master stage;
the flip-flop configured to, in a first mode of operation, latch data present at the data input at a master stage of the flip-flop based on a clock signal and configured to and buffer data present at the output of the master stage at the slave state of the flip-flop independent of the clock signal, and in a second mode of operation, buffer data at the data input at the master stage independent of the clock signal.

9. The flip-flop of claim 8, the flip-flop configured to, in the second mode of operation, latch data at the slave stage based on the clock signal.

10. A method, comprising:
in response to determining a master-slave flip-flop is in a first mode of operation, latching data at a master stage of the flip-flop based on a clock signal, the flip-flop including a master stage and a slave stage to receive first data propagated from an output of the master stage;
in response to determining the flip-flop is in a second mode of operation, buffering data at the master stage of the flip-flop independent of the clock signal
in response to determining the flip-flop is in the third mode of operation, buffering data at a slave stage of the flip-flop independent of the clock signal; and
in response to determining the flip-flop is in the fourth mode of operation, latching data at the slave stage based on the clock signal.

11. The method of claim 10, further comprising:
wherein buffering data at the master stage of the flip-flop comprises buffering data at the flip-flop independent of a test enable signal, the flip-flop configured to be operated in a test mode based on a state of the test enable signal.

12. The method of claim 11, further comprising selecting a data input of the flip-flop based on the state of the test enable signal.

13. The method of claim 1, wherein the slave stage is directly connected to the master stage.

* * * * *